(12) United States Patent
Humayun et al.

(10) Patent No.: US 11,095,118 B2
(45) Date of Patent: Aug. 17, 2021

(54) CONTROLLED HOLDUP DISCHARGE FOR IMPROVED COMPONENT RELIABILITY

(71) Applicant: Hamilton Sundstrand Corporation, Charlotte, NC (US)

(72) Inventors: Pervaze Humayun, Karnataka (IN); Midhun M. Hegden, Karnataka (IN)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 120 days.

(21) Appl. No.: 16/414,342

(22) Filed: May 16, 2019

(65) Prior Publication Data

US 2020/0235570 A1   Jul. 23, 2020

(30) Foreign Application Priority Data

Dec. 21, 2018   (IN) .............................. 201811048665

(51) Int. Cl.
*H02H 9/00* (2006.01)
*H02J 9/06* (2006.01)
*G01R 19/165* (2006.01)

(52) U.S. Cl.
CPC ............. *H02H 9/001* (2013.01); *H02J 9/061* (2013.01); *H02J 9/068* (2020.01); *G01R 19/165* (2013.01); *H02J 2310/44* (2020.01)

(58) Field of Classification Search
CPC ........ H02H 9/001; H02H 9/002; H02H 9/005; H02H 9/02; H02J 9/04; H02J 9/06; H02J 9/061; H02J 9/068; G01R 19/165
See application file for complete search history.

(56) References Cited

U.S. PATENT DOCUMENTS

| 4,811,190 A | 3/1989 | Keir et al. |
| 5,828,207 A | 10/1998 | Saadeh |
| 5,920,186 A | 7/1999 | Ninh et al. |
| 6,384,491 B1 | 5/2002 | O'Meara |
| 9,293,986 B2 | 3/2016 | Thandri et al. |
| 2006/0132105 A1* | 6/2006 | Prasad ................ H02M 1/4225 323/222 |
| 2006/0274468 A1* | 12/2006 | Phadke .................. H02H 9/001 361/93.1 |
| 2009/0230771 A1* | 9/2009 | De .......................... H02M 1/36 307/44 |

(Continued)

FOREIGN PATENT DOCUMENTS

| CA | 2688671 A1 | 6/2011 |
| EP | 2104201 A2 | 9/2009 |
| WO | 2014110018 A1 | 7/2014 |

OTHER PUBLICATIONS

Extended European Search Report; Application No. 19218982.7; dated Mar. 13, 2020; 8 pages.

*Primary Examiner* — Fred E Finch, III
(74) *Attorney, Agent, or Firm* — Cantor Colburn LLP

(57) ABSTRACT

A method of controlling discharge of a holdup capacitor in a power system having a voltage source, a holdup capacitor and a load. The method including operably connecting the voltage source to the load, monitoring a first voltage of the voltage source, and if the first voltage of the voltage source drops below a selected threshold, directing energy from the holdup capacitor to the load via a first path, and directing energy from the holdup capacitor to the load via a second path if a selected condition is satisfied.

13 Claims, 3 Drawing Sheets

(56) References Cited

U.S. PATENT DOCUMENTS

| | | | |
|---|---|---|---|
| 2011/0241637 A1* | 10/2011 | Parker | H02J 9/061 323/282 |
| 2012/0068542 A1* | 3/2012 | Alappat | H02J 9/061 307/66 |
| 2012/0299381 A1* | 11/2012 | Larson | H02J 9/06 307/60 |
| 2013/0039104 A1* | 2/2013 | Sharma | H02M 1/10 363/123 |
| 2017/0110876 A1* | 4/2017 | Wohlfarth | H02H 9/005 |
| 2017/0123445 A1* | 5/2017 | Muccini | G06F 1/26 |
| 2017/0329380 A1* | 11/2017 | Hung | H02M 1/36 |
| 2018/0175852 A1* | 6/2018 | Gangopadhya | H03K 17/168 |
| 2018/0234025 A1* | 8/2018 | Gharpure | H02M 1/32 |
| 2020/0014239 A1* | 1/2020 | Liu | H02J 1/10 |
| 2020/0067305 A1* | 2/2020 | Zhu | H02H 9/001 |

* cited by examiner

CONTROLLED HOLDUP DISCHARGE FOR IMPROVED COMPONENT RELIABILITY

CROSS-REFERENCE TO RELATED APPLICATIONS

This application claims the benefit of India Application No. 201811048665 filed Dec. 21, 2018, which is incorporated herein by reference in its entirety.

BACKGROUND

The present disclosure relates to controllers, power sources and loads associated with them, in particular, ensuring smooth shut down during abrupt power interruptions of power controller circuits and components on an aircraft.

Vehicles, such as aircraft, typically utilize one or more electronic control unit(s) (ECU) and/or Solid State Power Controllers (SSPC), various sensors, and actuators in various control applications to ensure inflight operation, provide for redundancy, and fail-operational capabilities. A primary function performed by a controller is power control and/or distribution. Many electronic systems are required to ensure a smooth shutdown during abrupt disruption scenarios by performing necessary housekeeping tasks such as shutting down selected peripherals, communicating with a master controller to indicate error, saving the status in non-volatile memory, and the like. To facilitate performing these tasks, a controller typically depends on a bank of holdup capacitors, normally charged to a high DC voltage (to increase energy density and reduce number of capacitors/capacitance) in this bank. Hereinafter, this is referred to as holdup capacitor bank.

FIG. 2 depicts a conventional power system 12 with a DC source 15 configured to provide power to a power supply 30 and ultimately a load 40. In the figure, capacitor 11 also denoted as $C_{HOLDUP}$ stores energy during the normal operation and supplies this energy during a power off when the DC power source 15 is not available. The duration for which the holdup capacitor 11 supports the system 10 is typically designed to be sufficient to at least perform the housekeeping required for an orderly shutdown of the system 13. When power is interrupted, voltage monitor 27 detects the loss of the DC source 15 and switches via switch 19 denoted as S1, the holdup capacitor 11 from charging to supplying energy to the power supply 30 and ultimately the load 40. Diodes 21 and 22 prevent unintended current flow between the power source 15 and the holdup capacitor 11. Switching from the voltage supplied by the DC source 15 during normal operation to the voltage supplied by holdup capacitor 11 during power interruptions is done quickly to ensure that the system 13 continues to operate seamlessly. However, this transition from a normally lower input voltage to a normally high voltage stored on the holdup capacitor 11 causes very large current to flow from the holdup capacitor 11 through the switch 19 and series diode 22 to the input capacitor 24 (of power supply 30), depicted as $C_{IN}$ in the figure for illustration. Unfortunately, the rapid discharge of the holdup capacitor exerts stresses on the components—in particular, the holdup capacitor 11 and the input capacitor 24 of the power supply. Moreover, high input voltage transient may affect the regulation of the output voltages of the power supply 30, causing damage to sensitive electronic components on the load side.

Therefore, what is needed is a method to provide a controlled discharge of the holdup capacitor 11 (charged to high voltage), such that the system 13 operates uninterrupted, but at the same time ensuring that no electrical stresses beyond the component ratings are exerted on the capacitors and other circuit elements.

SUMMARY

According to one embodiment, disclosed herein is a method of controlling discharge of a holdup capacitor in a power system having a voltage source, a holdup capacitor and a load. The method including operably connecting the voltage source to the load, monitoring a first voltage of the voltage source, and if the first voltage of the voltage source drops below a selected threshold, directing energy from the holdup capacitor to the load via a first path, and directing energy from the holdup capacitor to the load via a second path if a selected condition is satisfied.

In addition to one or more of the features described above, or as an alternative, further embodiments of the method may include that the voltage source is a direct current (DC) source and wherein the holdup capacitor is charged to a second DC voltage.

In addition to one or more of the features described above, or as an alternative, further embodiments of the method may include that the second DC voltage is greater than the first DC voltage.

In addition to one or more of the features described above, or as an alternative, further embodiments of the method may include that the first selected threshold is 12 volts.

In addition to one or more of the features described above, or as an alternative, further embodiments of the method may include that the directing of energy is via a switching device.

In addition to one or more of the features described above, or as an alternative, further embodiments of the method may include that the switching device is an active device.

In addition to one or more of the features described above, or as an alternative, further embodiments of the method may include that the first path includes a current limiting device.

In addition to one or more of the features described above, or as an alternative, further embodiments of the method may include that the current limiting device is a resistor or an active device.

In addition to one or more of the features described above, or as an alternative, further embodiments of the method may include that the selected duration is based at least in part on the voltage of the holdup capacitor, the voltage at the load, the input capacitor of the power supply, the resistance of the current limiting path and the capacitance of the holdup capacitor.

In addition to one or more of the features described above, or as an alternative, further embodiments of the method may include disconnecting the holdup capacitor from the load under selected conditions.

Also described herein in another embodiment is a system for controlling discharge of a holdup capacitor in a power system. The system includes a voltage source having a first voltage, a load operably connected to the voltage source and configured to receive power from the voltage source, a first switching device operably connected between a holdup capacitor and the load forming a first path for energy to be supplied to the load from the holdup capacitor, and a second switching device operably connected between the holdup capacitor and the load forming a second path for energy to be supplied to the load from the holdup capacitor. The system also includes a voltage monitor, the voltage monitor operably configured to measure the first voltage of the voltage source, and if the first voltage of the voltage source drops below a selected threshold, the voltage monitor operably configured to cause the first switching device to direct energy from the holdup capacitor to the load via the first path. The second switching device is configured to direct energy from the holdup capacitor to the load via the second path if a selected condition is satisfied.

In addition to one or more of the features described above, or as an alternative, further embodiments of the system may include that the voltage source is a direct current (DC) source and wherein the holdup capacitor is charged to a second DC voltage.

In addition to one or more of the features described above, or as an alternative, further embodiments of the system may include that the second DC voltage is greater than the first DC voltage.

In addition to one or more of the features described above, or as an alternative, further embodiments of the system may include that the first selected threshold is 12 volts.

In addition to one or more of the features described above, or as an alternative, further embodiments of the system may include that, between the first switching device and the second switching device, at least one of them is an active device.

In addition to one or more of the features described above, or as an alternative, further embodiments of the system may include that the first path includes a current limiting device.

In addition to one or more of the features described above, or as an alternative, further embodiments of the system may include that the current limiting device is a resistor or an active device.

In addition to one or more of the features described above, or as an alternative, further embodiments of the system may include that the selected duration is based at least in part on the voltage of the holdup capacitor, the voltage at the load, the input capacitor of the power supply, the resistance of the current limiting path and the capacitance of the holdup capacitor.

In addition to one or more of the features described above, or as an alternative, further embodiments of the system may include the first switching device and the second switching device disconnecting the holdup capacitor from the load under selected conditions.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description.

BRIEF DESCRIPTION OF THE DRAWINGS

The subject matter, which is regarded as the disclosure, is particularly pointed out and distinctly claimed in the claims at the conclusion of the specification. The foregoing and other features and advantages of the disclosure are apparent from the following detailed description taken in conjunction with the accompanying drawings, in which:

DETAILED DESCRIPTION

Figure 1:
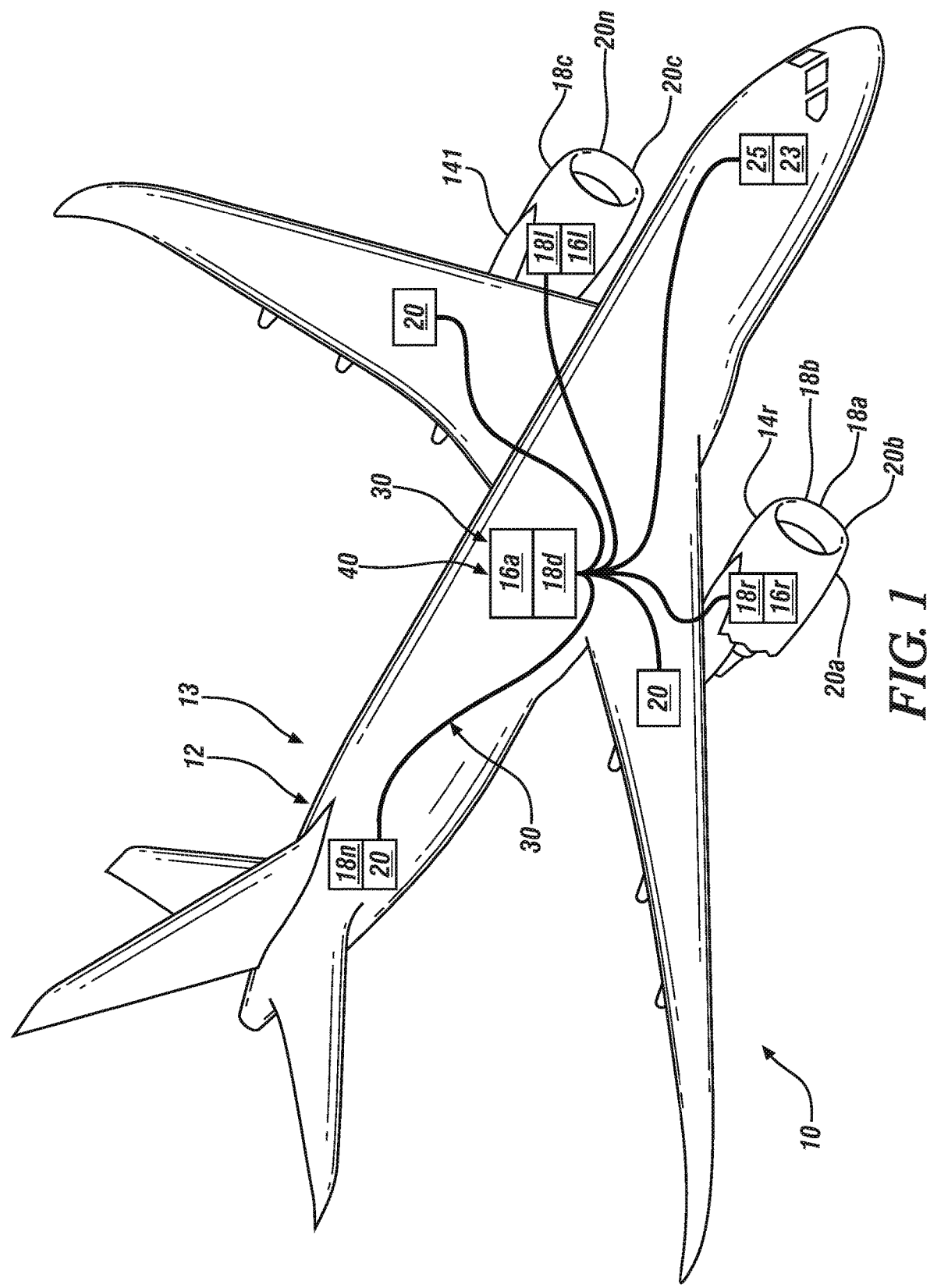
FIG. 1 depicts an example of an aircraft with electrical power systems in accordance with an exemplary embodiment.
Figure 2:
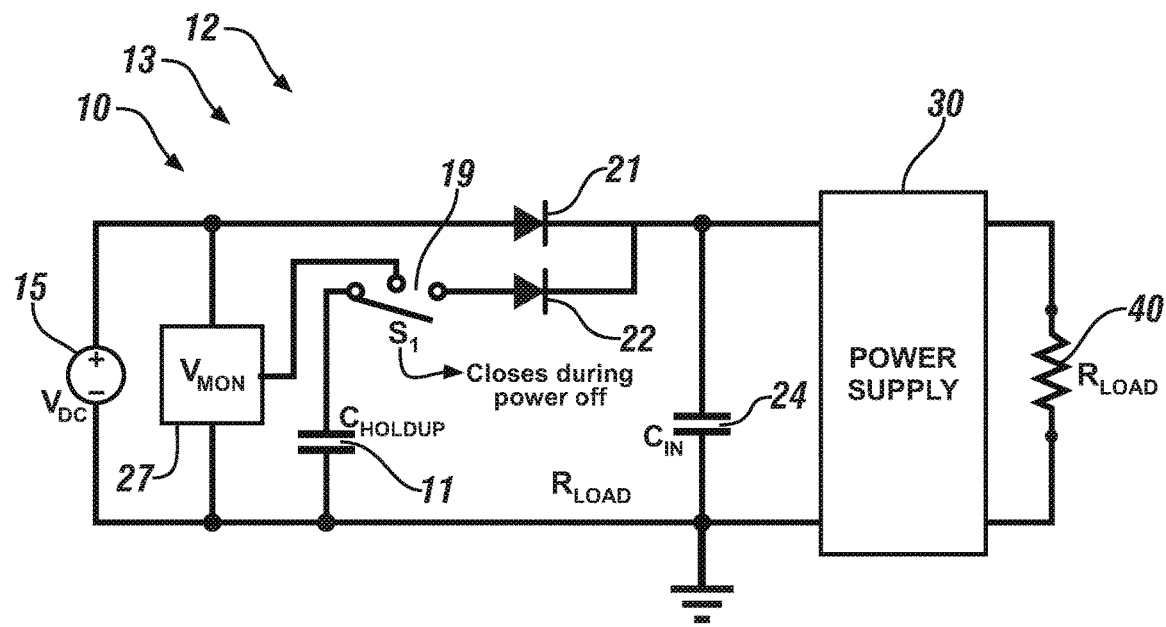
FIG. 2 depicts a simplified diagram of a conventional power system with a holdup capacitor.

For the purposes of promoting an understanding of the principles of the present disclosure, reference will now be made to the embodiments illustrated in the drawings, and specific language will be used to describe the same. It should nevertheless be understood that no limitation of the scope of this disclosure is thereby intended. The following description is merely illustrative in nature and is not intended to limit the present disclosure, its application or uses. It should be understood that throughout the drawings, corresponding reference numerals indicate like or corresponding parts and features. As used herein, the term controller refers to processing circuitry that may include an application specific integrated circuit (ASIC), an electronic circuit, an electronic processor (shared, dedicated, or group) and memory that executes one or more software or firmware programs, a combinational logic circuit, and/or other suitable interfaces and components that provide the described functionality.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and/or a direct "connection".

In general, embodiments herein relate to an application of a method and/or system to provide a controlled discharge of the holdup capacitor bank (charged to high voltage), such that the system operates uninterrupted, but at the same time ensuring that no electrical stresses beyond the component ratings are exerted on the capacitor bank or the electrical circuit. Advantageously, the described embodiments provide a clear scheme with a fast and slow lane discharge/charge architecture that reduces the current stress on the holdup capacitor and input capacitors. Thereby, the described embodiments improve the long-term reliability of the components, while keeping the power loss to a minimum. In addition the described embodiments provides uninterrupted input power to the electronic system during the event of a power interruption including transitioning smoothly from the input power source to the holdup capacitor, thereby reducing the strain on the electronic system that it powers. Another advantage of the described embodiments is that they are implemented using only a small number of discrete components, ensuring very low cost and high reliability.

Referring to FIG. 1, an aircraft 10 is shown. Aircraft 10 includes one or more control systems shown generally as 12. The control system 12 may include a power system 13 that interconnects with one or more controllers referred to generally as 16 and more specifically as 16$l$, 16$r$ commonly located at or near each engine 14$l$, 14$r$. Other controllers 16 are also be depicted in this instance as 16$a$, 16$b$, and the like. In the described embodiments, the reference numerals are annotated with an "l" or "r" to denote the left or right side of the aircraft 10, respectively, for the purpose of simplicity of description. Likewise, the annotation "a", "b", . . . "n" is employed to simplify designation of a multiple enumeration of a component or element.

Each of the controllers 16 are configured to receive various sensor signals from sensors referred to generally as 18 and individually as 18$a$, 18$b$, . . . 18$n$ all over the aircraft 10 and may also operate one or more actuators shown generally as 20, and more specifically as 20*a*, 20*b*, 20*c*, . . . 20*n* to control the operation of the engines 14*r*, 14*l*, flight controls, (not shown), power systems, (not shown), and the like. The control system 12 and power system 13 may also be operably connected to various other components throughout the aircraft 10, including, but not limited to other controllers 16, control panels 23, displays 25, and the like.

Figure 3:
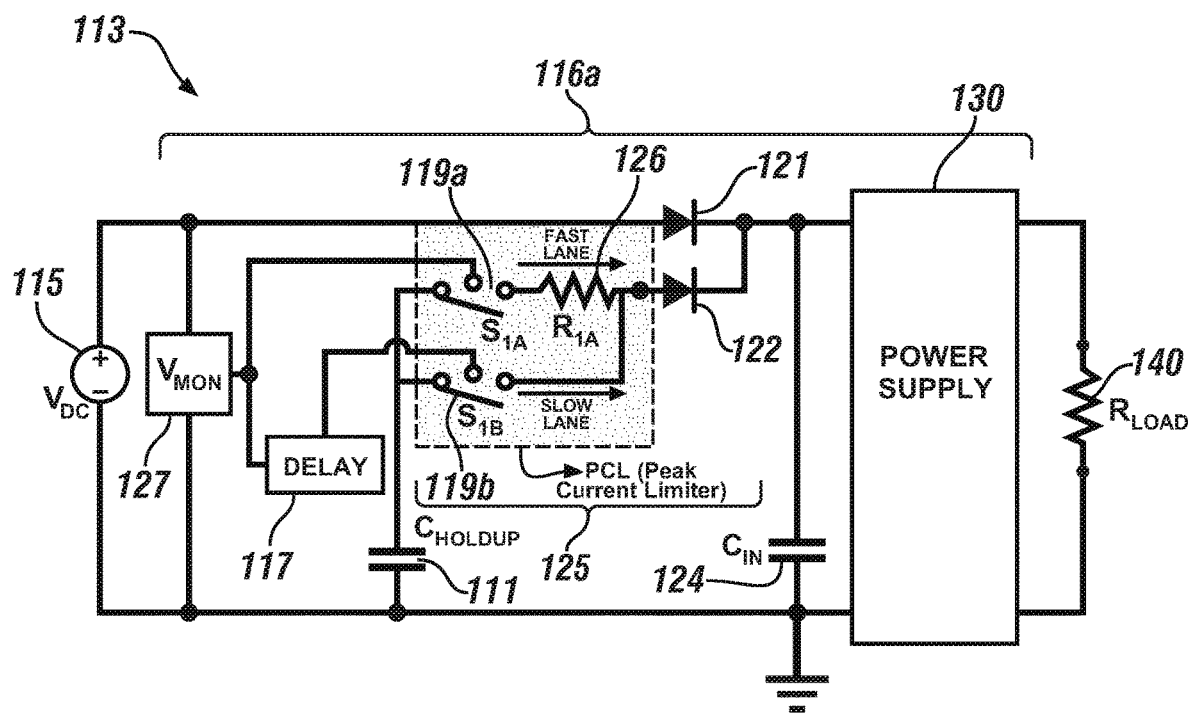
FIG. 3 depicts a simplified diagram of power system with a holdup capacitor in accordance with an embodiment.

FIG. 3 depicts a partial block diagram of a power system 13 in accordance with an embodiment, where the reference numerals are incremented by 100 for the purposes of illustrating the described embodiments. The power system 113 may be part of a controller 16, e.g., now 116, and more specifically 116*a*. In yet another embodiment, the configuration could be the opposite with the controller 116 is, or provides a portion of the power system 113, as illustrated by the general depiction of 116*a* and described further herein. The power system 113 includes a DC power source 115 configured to provide power to a power supply 130 and ultimately a load 140. In the figure, capacitor 111 also denoted as $C_{HOLDUP}$ stores energy during the normal operation and supplies this energy during a power off when the DC power source 115 is not available. The holdup capacitor 111 and its charge voltage are typically designed to provide sufficient energy to at least perform the housekeeping required for an orderly shutdown of the power system 113. In normal operation, power is provided by the DC power source 115 and is routed through rectifier 121 to the input capacitor 124 (of power supply 130), depicted as $C_{IN}$ in the figure for illustration. It should be appreciated that while the input capacitor $C_{IN}$ is depicted as separate, it is normally an integral part of the power supply 130. In addition, the power supply 130 generates a high voltage DC output (not shown) to charge the holdup capacitor 111.

When power from the power source 115 is interrupted, voltage monitor 127 detects the loss of the DC power source 115 and switches via switch 119 denoted as S1 (comprised of S1A and S1B), the holdup capacitor 111 from charging to supplying energy to the power supply 130 and ultimately the load 140. Diodes 121 and 122 prevent unintended current flow between the power source 115 and the holdup capacitor 111. Switching from the voltage supplied by the DC power source 115 during normal operation to the voltage supplied by holdup capacitor 111 during power interruptions is done quickly to ensure that the system 113 continues to operate seamlessly. However, as stated earlier, this transition from a normally lower input voltage supplied by the power source 115 to a normally high voltage stored on the holdup capacitor 111 generates a large inrush current flowing from the holdup capacitor 111 to the input capacitor 124.

To alleviate this issue and the stresses normally resulting from the transition due to a loss of the power source 115 in the embodiment, current limiting function 125, referred to as a PCL (Peak Current Limiter), is employed. The current limiting function 125 employs dual discharge paths to route current from the holdup capacitor 111 to the power supply 130 (and the input capacitor 124). With the described dual switching device approach, the first discharge path starts at the holdup capacitor 111 and is routed through a first switching device S1A denoted as 119*a* in series with a current limiter 126 (in this example, the resistor R1A), to the diode 122 and on to the power supply 130. In addition, a parallel path is provided from the holdup capacitor 111 through switching device S1B denoted as 119*b*, to the rectifier 122 and on to the power supply 130. In the embodiment, as soon as the input power from the power source 115 is lost or unavailable, a voltage monitor circuit 127 detects an under voltage condition and turns S1A "ON" to supply energy from the holdup capacitor 111 to the power supply 130 and thus the load 140. However, to avoid large inrush currents as described herein, the series resistor R1A denoted as 126 serves as a current limiter and ensures the current stays within a selected acceptable level.

Continuing with FIG. 3, the series resistor 126 may readily be sized to ensure corresponding currents do not stress the capacitors or the power supply. Since the switch S1A turns on instantly on power off and the current flows through this path without delay, this path is denoted the 'FAST LANE'. However, the FAST LANE path will result in significant power being dissipated in the resistor R1A denoted as 126 due to the high current that will flow initially during power off. To accommodate this concern, a parallel path without a resistor is also put in place, which is activated after a short time delay administered by time delay 117. In this manner, by the time the peak current flow reduces through S1A, the switch S1B is activated, which becomes the primary path for the current flow due to its lower relative impedance. In the embodiment, the time delay is selected based on several operational parameters of the circuit including, but not limited to the voltage at the power supply 130, the voltage of the holdup capacitor 111, the capacitance of the holdup capacitor 111, the capacitance of the input capacitor 124, the value of the resistor 126, the current limiting provided in the "Fast Lane", and the like. In the embodiment, a nominal time delay of 150 microseconds is employed, though other values are possible. Since this path is activated after a short time delay of a selected duration, this path is denoted the 'SLOW LANE'. Hence, by having a high impedance fast lane for the initial controlled discharge of the holdup capacitor 111 and a low impedance slow lane during steady-state to reduce the power dissipation in the current limiter 125, a solution is provided that addresses both component safety and power dissipation losses.

It should be appreciated that while in the exemplary embodiments, a series resistor 126 is described, such description is merely illustrative. Any form of impedance whether passive or active may be employed to limit the current in the first path. For example, a resistor, inductor, or a combination thereof could be employed. Moreover, active devices such as current sources, or active current limiting devices may also be employed. Furthermore, it should also be appreciated that while in the exemplary embodiments, a switch is described for providing the switching functions as described, such description is also merely illustrative. Any form of switching device including active devices may be employed to activate the current paths from the holdup capacitor 111 to the input capacitor 124 and power supply 130. For example, switches, relays, and the like for passive devices, or active devices such as BJTs, FETs, IGBTs, MOSFETs, SCRs, Thyristors and the like are also possible. Moreover, in the embodiment the switching function of switching device 119*a* and the current limiting function of the resistor 126 may be combined, employing active devices such as a transistor to limit the current as described herein.

It should further be appreciated that while the described embodiment includes activating switch S1*b* denoted as 119*b* after a selected duration, such a description is merely illustrative of one embodiment. In another embodiment, the activation could be based on the voltage across the resistor 126, the current supplied by the holdup capacitor 111, the voltage of the holdup capacitor 111, the voltage of the input capacitor 124, the voltage of the load, and the like.

Figure 4:
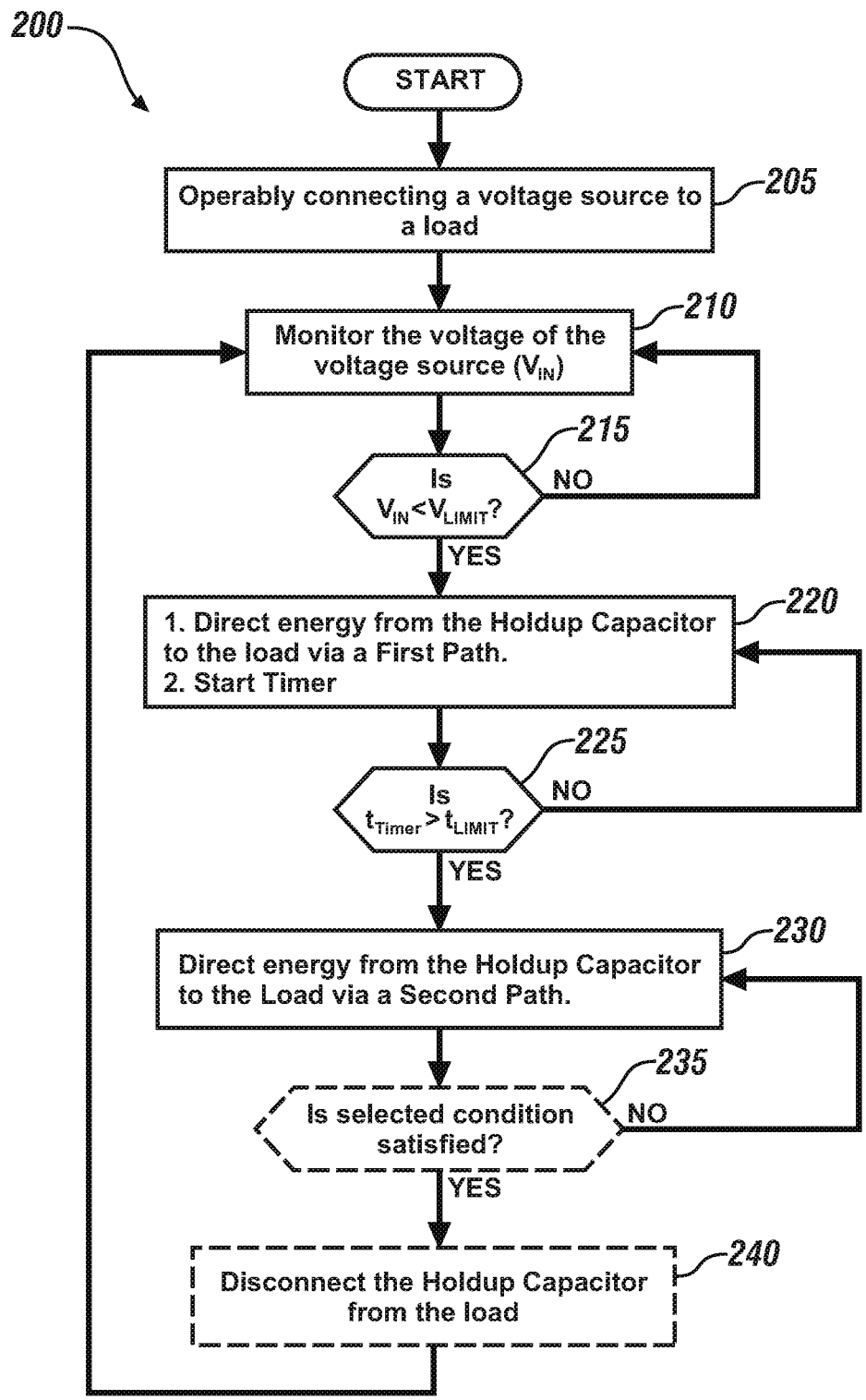
FIG. 4 depicts a simplified flowchart depicting the method for controlling the discharge of a holdup capacitor in accordance with an embodiment.

FIG. 4 depicts a flowchart of a method 200 of providing controlled discharge of the holdup capacitor 111 in accordance with an embodiment. The description on FIG. 4 will refer, from time to time, to elements in FIGS. 1 and 3. Turning to the method 200, the method 200 initiates at process block 205 with operably connecting a power source 115 to a load. In this instance, the load includes the input capacitor 124, power supply 130, and the actual load 140. At process step 210, the method 200 continues with monitoring the voltage from the power source 115. At process step 215, if, as a result of the monitoring of voltage source 115, it is determined that the voltage is dropped below a selected threshold, the method continues to process step 220, otherwise the method iterates, returning to process step 210. The method continues at process step 220 with directing the energy from the holdup capacitor 111 to the load via a first current limited path and initiating a timer. As determined by decision block 225, if the timer is less than a selected duration, the process reiterates to process step 220 to continue. If the timer has exceeded a selected duration, the method 200 continues to process step 230 with directing energy from the holdup capacitor to the load via a second path. Furthermore, optionally the method 200 may also include determining if a selected condition has been satisfied as depicted at process step 235. If so, the process continues with disconnecting the holdup capacitor from the load under selected conditions as depicted at optional process step 240. An example of such a condition could be, the power source 115 returning to an acceptable level, in which case, the need for a connection between the holdup capacitor 111 and the load, is obviated. Finally, the process reiterates to process step 210 to continue monitoring the voltage of the voltage source.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more features, integers, steps, operations, element components, and/or groups thereof. For the purposes of this disclosure, it is further understood that the terms "inboard" and "outboard" can be used interchangeably, unless context dictates otherwise.

The present embodiments may be a system, a method, and/or a computer program product at any possible technical detail level of integration. The computer program product may include a computer readable storage medium (or media) having computer readable program instructions thereon for causing a processor to carry out aspects of the present disclosure.

The flowchart and block diagrams in the figures illustrate the architecture, functionality and operation of possible implementations of systems, methods and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed concurrently (or nearly concurrently), or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments.

What is claimed is:

1. A method of controlling discharge of a holdup capacitor in a power system having a voltage source, a holdup capacitor and a load, the method comprising:
operably connecting the voltage source to the load;
monitoring a first DC voltage of the voltage source;
if the first DC voltage of the voltage source drops below a selected threshold, directing energy from the holdup capacitor to the load via a first path, and starting a timer; and
directing energy from the holdup capacitor to the load via a second path after a selected duration; and
disconnecting the holdup capacitor from the load if a selected condition is satisfied,
wherein the first path includes a current limiting device, and wherein the current limiting device comprises at least one of a resistor and an active device, wherein the first path defines a high impedance path;
the second path defines a low impedance path; and
wherein the first and second paths are parallel paths between the holdup capacitor and the load.

2. The method of controlling discharge of a holdup capacitor as recited in claim 1, wherein the voltage source is a direct current (DC) source and wherein the holdup capacitor is charged to a second DC voltage.

3. The method of controlling discharge of a holdup capacitor as recited in claim 2, wherein the second DC voltage is greater than the first DC voltage.

4. The method of controlling discharge of a holdup capacitor as recited in claim 1, wherein the selected threshold is 12 volts.

5. The method of controlling discharge of a holdup capacitor as recited in claim 1, wherein the directing of energy is via a switching device.

6. The method of controlling discharge of a holdup capacitor as recited in claim 5, wherein the switching device is an active device.

7. The method of controlling discharge of a holdup capacitor as recited in claim 1, wherein the selected duration is based at least in part on at least one of a voltage of the holdup capacitor, a voltage at the load, a resistance of the first path, a capacitance of the holdup capacitor, and a capacitance of the load.

8. A system for controlling discharge of a holdup capacitor in a power system, the system comprising:
a voltage source having a first DC voltage;
a load operably connected to the voltage source and configured to receive power from the voltage source;

a first switching device operably connected between a holdup capacitor and the load forming a first path for energy to be supplied to the load from the holdup capacitor;

a second switching device operably connected between the holdup capacitor and the load forming a second path for energy to be supplied to the load from the holdup capacitor;

a voltage monitor, the voltage monitor operably configured to
measure the first DC voltage of the voltage source; and
if the first DC voltage of the voltage source drops below a selected threshold, the voltage monitor operably configured to cause the first switching device to direct energy from the holdup capacitor to the load via the first path, and starting a timer; and wherein:
the second switching device is configured to direct energy from the holdup capacitor to the load via the second path after a selected duration; and
the first switching device and the second switching device are configured to disconnect the holdup capacitor from the load if a selected condition is satisfied;

wherein the first path includes a current limiting device, and wherein the current limiting device comprises at least one of a resistor and an active device, wherein the first path defines a high impedance path;

the second path defines a low impedance path; and wherein the first and second paths are parallel paths between the holdup capacitor and the load.

9. The system for controlling discharge of a holdup capacitor as recited in claim 8, wherein the voltage source is a direct current (DC) source and wherein the holdup capacitor is charged to a second DC voltage.

10. The system for controlling discharge of a holdup capacitor as recited in claim 9, wherein the second DC voltage is greater than the first DC voltage.

11. The system for controlling discharge of a holdup capacitor as recited in claim 8, wherein the selected threshold is 12 volts.

12. The system for controlling discharge of a holdup capacitor as recited in claim 8, wherein, at least one of the first switching device and the second switching device is an active device.

13. The system for controlling discharge of a holdup capacitor as recited in claim 8, wherein the selected duration is based at least in part on at least one of a voltage of the holdup capacitor, a voltage at the load, a resistance of the first path a capacitance of the holdup capacitor, and a capacitance of the load.

* * * * *